US007094650B2

(12) United States Patent
Chaudhary et al.

(10) Patent No.: US 7,094,650 B2
(45) Date of Patent: Aug. 22, 2006

(54) GATE ELECTRODE FOR FINFET DEVICE

(75) Inventors: Nirmal Chaudhary, Austin, TX (US);
Thomas Schulz, Austin, TX (US);
Weize Xiong, Austin, TX (US); Craig Huffman, Austin, TX (US)

(73) Assignees: Infineon Technologies AG, Munich (DE); Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/039,173

(22) Filed: Jan. 20, 2005

(65) Prior Publication Data

US 2006/0160312 A1 Jul. 20, 2006

(51) Int. Cl.
*H01L 21/336* (2006.01)
(52) U.S. Cl. ..................... 438/283; 438/284; 257/365; 257/401; 257/623
(58) Field of Classification Search ................ 438/279, 438/283, 284; 257/347, 365, 401, 623
See application file for complete search history.

(56) References Cited

U.S. PATENT DOCUMENTS

| 6,413,802 | B1* | 7/2002 | Hu et al. ..................... 438/151 |
| 6,909,147 | B1* | 6/2005 | Aller et al. .................. 257/347 |
| 2004/0036126 | A1* | 2/2004 | Chau et al. ................. 257/401 |
| 2004/0222477 | A1* | 11/2004 | Aller et al. ................. 257/412 |
| 2004/0227178 | A1* | 11/2004 | Ding ........................... 257/315 |

OTHER PUBLICATIONS

Koch, N., et al., "Conjugated Organic Molecules on Metal Versus Polymer Electrodes: Demonstration of a Key Energy Level Alignment Mechanism," Applied Physics Letters, vol. 82, No. 1 (Jan. 6, 2003) pp. 70-72.
Hisamoto, D., et al., "A Folded-Channel MOSFET For Deep-Sub-Tenth Micron Era," IEDM (1998) pp. 1032-1034.
Choi, Y.-K., et al., "Sub-20nm CMOS FinFET Technologies," IEEE (2001) 4 pages.
Chau, R., "Si and Non-Si Nanotechnologies and Their Benchmarking," (Apr. 25, 2005) pp. 1-17.
David, K., "Silicon Nanotechnology at Intel," Intel Nanotechnology Virtual Open House (Oct. 22, 2004) pp. 1-26.

* cited by examiner

*Primary Examiner*—Trung Dang
(74) *Attorney, Agent, or Firm*—Slater & Matsil L.L.P.

(57) ABSTRACT

In a method of forming a semiconductor device, a self-planarizing conductive layer is formed over a substrate that includes a topography having sharp drop-offs. The self-planarizing conductive layer is characterized by a substantially flatter surface than the underlying topography. As a result of the self-planarizing layer, a masking layer having a more uniform thickness may be formed over the conductive layer. Because the masking layer has a more uniform thickness, the masking layer may easily be patterned without causing damage to the underlying materials. These techniques may be used to fabricate, among other things, a FinFET without parasitic spacers formed around the fins and the source/drain regions.

20 Claims, 5 Drawing Sheets

GATE ELECTRODE FOR FINFET DEVICE

TECHNICAL FIELD

The present invention relates generally to semiconductor devices and, more particularly, to gate electrodes for fin field-effect transistors (FinFETs) and methods of manufacture.

BACKGROUND

Size reduction of field-effect transistors (FETs), including reduction of the gate length and gate oxide thickness, has enabled the continued improvement in speed, performance, density, and cost per unit function of integrated circuits over the past few decades. In recent years, advances in technology have yielded a transistor design that utilizes raised source/drain regions having one or more raised channel regions (referred to as fins) interconnecting the source and drain regions. A gate is formed by depositing a conductive layer over and/or adjacent to the fins. This type of transistor is commonly referred to as a FinFET. It has been found that FinFET designs provide better scalability as design requirements shrink and better short-channel control.

Figure 1:
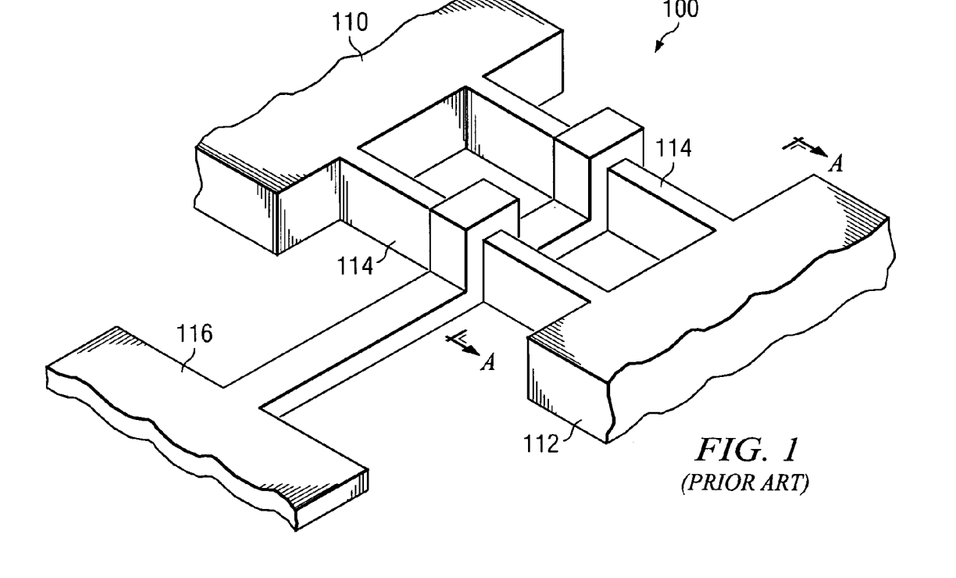
FIG. 1 is a perspective view of a desired dual-fin FinFET.

FIG. 1 illustrates a perspective view of a dual-fin FinFET 100. The FinFET 100 includes a source 110 and a drain 112 interconnected by fins 114. A gate electrode 116 comprises a contact area and a line that extends over the fins 114. In this embodiment, current flows from the source 110 to the drain 112 when a voltage is applied to the gate electrode 116. Problems, however, may occur during fabrication that may adversely affect the performance of the FinFET.

Figure 2A:
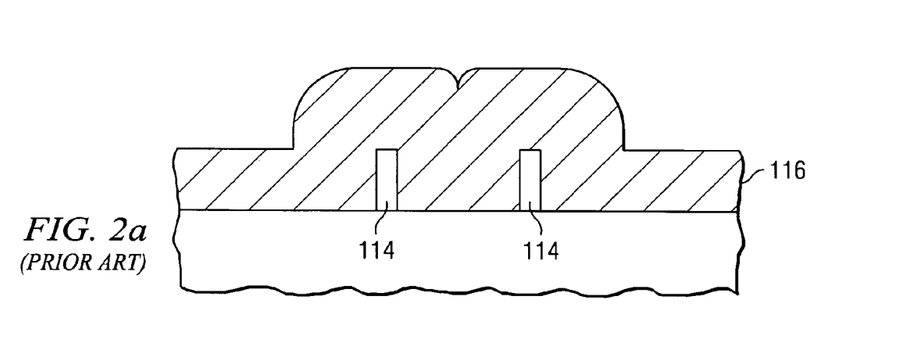
FIGS. 2a–2e illustrate the formation of parasitic spacers around the fins and source/drain regions of a FinFET.

FIGS. 2a–2e, which are cross-section views taken along the A—A line of FIG. 1, illustrate one such problem that results from the topography of the fin and the source/drain regions. Referring first to FIG. 2a, a gate stack 116 is deposited over the etched fins 114. As illustrated in FIG. 2a, the topography of the underlying fins 114 and source/drain regions (not shown) is transferred on to the gate stack 116. This may result in severe drop-off in the surface of the gate stack film over the fins 116 and source/drain regions.

Figure 2B:
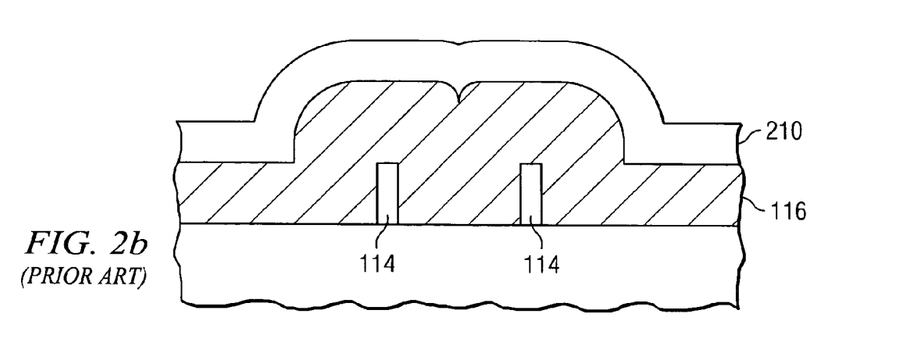
Figure 2C:
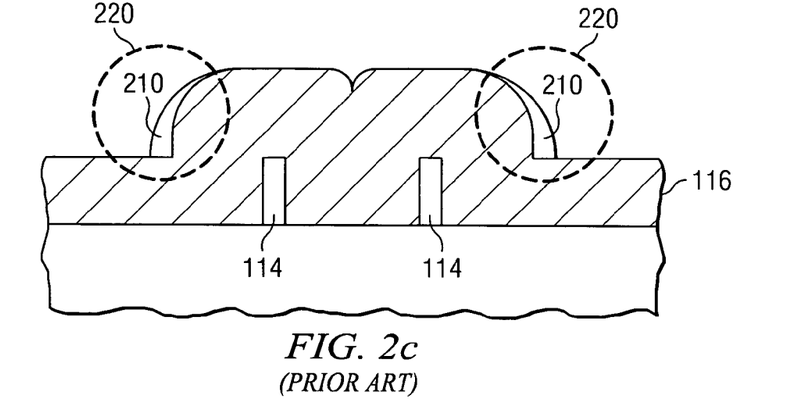

In FIG. 2b, an anti-reflective coating (ARC) 210, which acts as a hard mask, is spin coated onto the surface. FIG. 2c illustrates the situation after a photo-resist has been applied and patterned, and an etching step has been performed to remove unwanted portions of the ARC 210. The etching step typically uses an end-point signal to indicate when the gate stack 116 has been exposed. Often, however, residual ARC remains after the ARC open step in areas in which the ARC is thicker, such as regions 220 of FIG. 2c. This results in incomplete hard mask open in areas with severe topography.

Figure 2D:
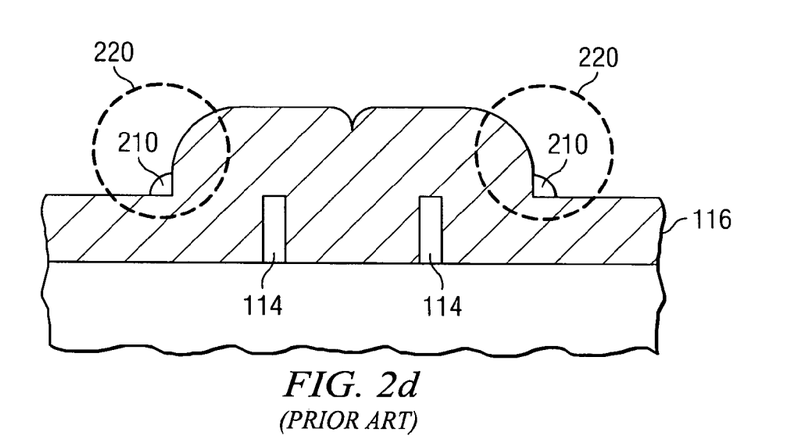

FIG. 2d illustrates the FinFET after an over-etch process has been performed to attempt removal of the remaining ARC 210. As illustrated in FIG. 2d, however, some of the ARC 210 remains after the over-etch process. Performing the over-etch process for a longer duration is not typically preferred due to damage that may occur to the underlying gate stack.

Figure 2E:
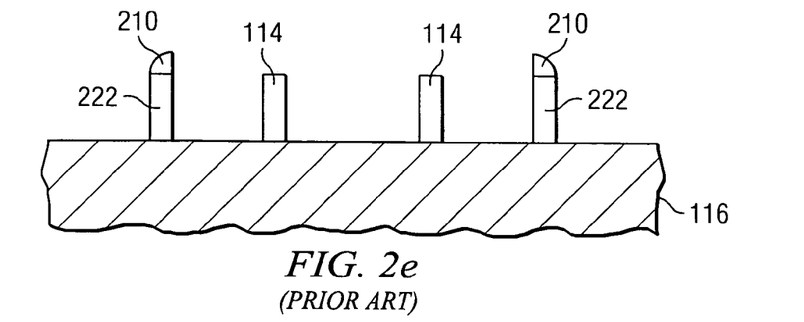

FIG. 2e illustrates the resulting structure after an etch is performed to remove the excess gate stack material. As illustrated, the excess ARC 210 causes residual gate electrode material, e.g., parasitic spacers 222, running along the outer periphery of the active area. These parasitic spacers 222 may adversely affect the performance of the. FinFET.

Figure 2F:
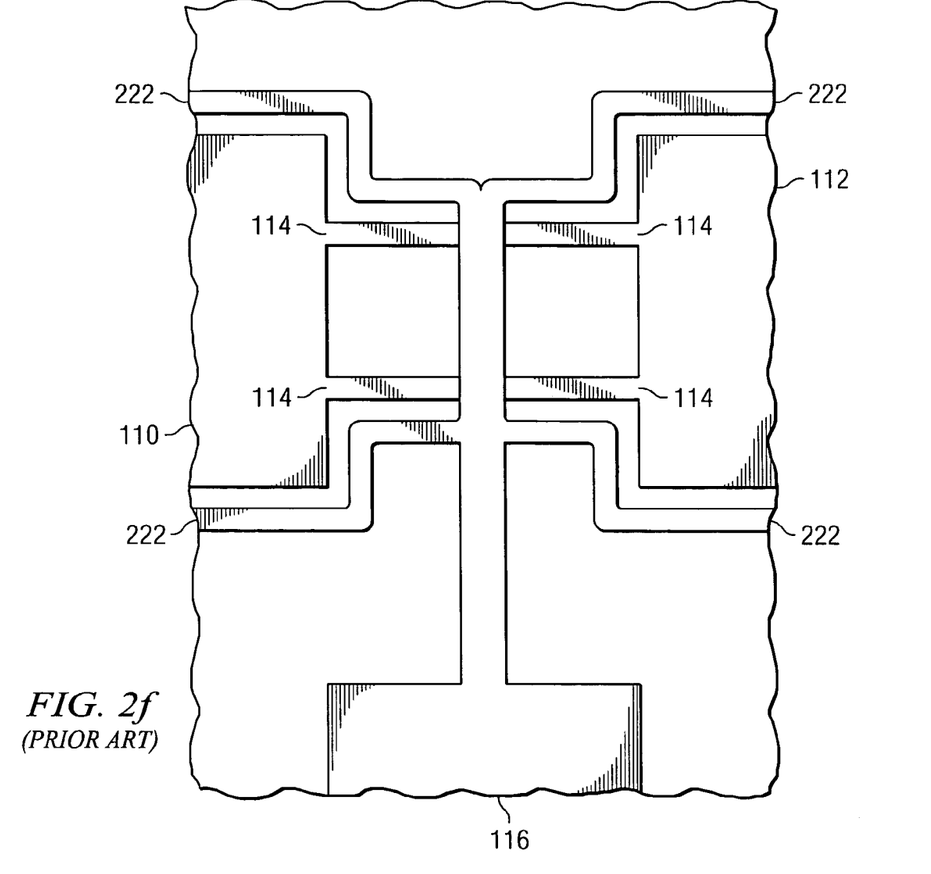
FIG. 2f is a plan view of a dual-fin FinFET in accordance with process steps illustrated in FIGS. 2a–2e.

FIG. 2f is a plan view of the dual-fin FinFET illustrated in FIG. 1 after performing the process described above. Note that the parasitic spacers 222 are formed around the source/drain regions and the fins. These parasitic spacers (or residual poly stringers) 222 can adversely affect the performance of the FinFET, and in some cases, the parasitic spacers 222 can cause electrical shorts between the gate and the source/drain regions, rendering the FinFET inoperable.

This problem may be prevented or reduced when using 248 nm lithography processes because of the large resist budget. This allows an excessive over etch during ARC open process, thus ensuring that all excess ARC is cleared in all areas. However, some processes require a smaller resist budget mask in the gate stack definition. For example, processes for fabricating FinFET devices having sub 50 nm gates utilize 193 nm lithography technology have very small resist budget mask in the gate stack definition. In these cases, an over-etch process may not be practical.

One attempt to solve this problem is a thick-layer approach, which involves forming a thick gate stack, which is typically thicker than the height of the fins. An etch-back process is performed to reduce the thickness of the gate stack, resulting in a layer that is more planarized than the surface of the beginning gate stack. As a result of the more planarized surface, an ARC layer may be deposited and patterned such that the excess ARC layer is completely removed, preventing the parasitic spacers described above.

One disadvantage of the thick-layer approach is that the very thick poly-layer itself causes a higher degree of film thickness non-uniformity in the deposited film. This initial non-uniformity can further be worsened by the plasma etch-back process that would typically be a fixed-time etch process where no endpoint signal is employed.

Therefore, there is a need for a method to form a FinFET without having a parasitic spacer formed around the fins and the source/drain regions.

SUMMARY OF THE INVENTION

These and other problems are generally reduced, solved or circumvented, and technical advantages are generally achieved, by embodiments of the present invention, which provides a FinFET without a parasitic spacer.

In an embodiment of the present invention, a method of forming a FinFET is provided. The method comprises forming a source region on a substrate; forming a drain region on the substrate; forming one or more fins interconnecting the source region and the drain region; forming a self-planarizing conductive layer over the substrate, the self-planarizing layer having a substantially flatter topography than an underlying topography; forming a mask layer over the self-planarizing conductive layer; patterning the mask layer; and removing excess portions of the self-planarizing layer.

In another embodiment of the present invention, a transistor formed on a substrate is provided. The transistor comprises a source region formed on a substrate; a drain region formed on a substrate; one or more fins interconnecting the source region and the drain region; and a gate electrode overlying the fins, a surface of the gate electrode having a substantially planar surface.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described in the context of a dual-fin FinFET. Embodiments of the present invention, however, may be used in a variety of contexts. For example, embodiments of the present invention may be used to fabricate FinFETs having fewer or more fins or any other type of device in which the topography is such that it is difficult to completely remove unwanted mask material. Furthermore, embodiments of the present invention have been found to be particularly useful when using 193 nm and below lithography techniques.

Figure 3:
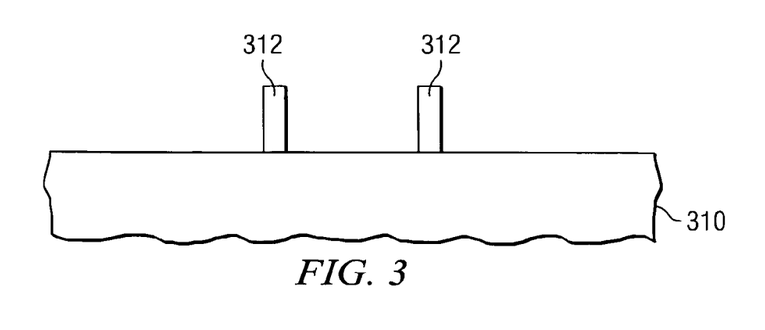
FIGS. 3–7 illustrate the various process steps of fabricating a FinFET in accordance with an embodiment of the present invention.

Referring first to FIG. 3, a substrate 310 is shown having fins 312 formed thereon. The substrate 310 may comprise bulk silicon, doped or undoped, or an active layer of a semiconductor-on-insulator (SOI) substrate. In a preferred embodiment, the substrate 310 comprises the buried oxide (BOX) layer of a SOI substrate. Generally, an SOI comprises a layer of a semiconductor material, such as silicon, formed on an insulator layer. The insulator layer may be, for example, a buried oxide (BOX) layer or a silicon oxide layer. The insulator layer is typically provided on a layer of silicon or glass. Other substrates, such as a multi-layered structures, gradient layers, silicon germanium, one or more semiconductor layers over a silicon germanium layer, or the like, may also be used. In this preferred embodiment, the fins 312 may comprise a portion of the top semiconductor layer.

The fins 312 may be any type of configuration and may include multiple layers. For example, in an embodiment of the present invention the fins 312 comprise a semiconductor body with a mask layer (such as an oxide-nitride-oxide mask) on top and a gate dielectric layer formed along the sidewalls of the fins 312. This type of structure is commonly used for a two-gate FinFET.

In another embodiment, the fins 312 may include a semiconductor body with a gate dielectric layer formed over the sidewalls and the top. The fins in this embodiment are frequently used for a triple-gate FinFET.

In yet another embodiment, the fins 312 may comprise a semiconductor body having a bottom portion narrower than a top portion, giving the body an undercut region near the fin-substrate junction. The semiconductor body may then be covered with a gate dielectric layer. This type of fin structure is commonly referred to as an Omega-FET.

It should be noted that the examples listed above of the fin structure are provided for illustrative purposes only. Embodiments of the present invention are equally applicable to other type of fin structures, including other types of materials, layers, shapes, and the like. As discussed above, embodiments of the present invention may be useful in fabricating any type of FinFET wherein the topography of the deposited gate layer and the overlying masking layers contain sharp drop-offs.

Figure 4:
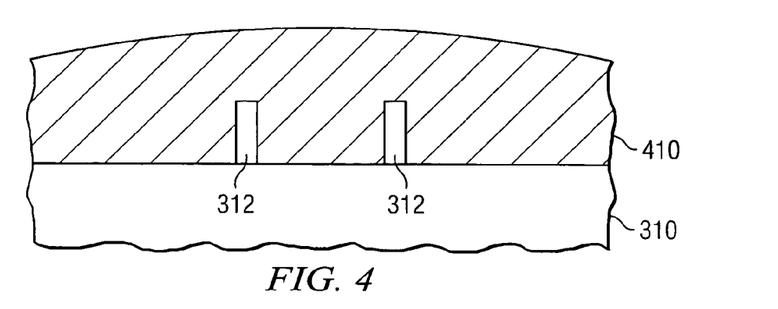

FIG. 4 illustrates the substrate 310 of FIG. 3 after a conductive layer 410 has been formed over the fins 312 in accordance with an embodiment of the present invention. As illustrated in FIG. 4, embodiments of the present invention utilize a self-planarizing conductive layer, wherein the self-planarizing conductive layer is characterized by a surface being substantially devoid of sharp drop-offs that may be present on the underlying surface (even if not perfectly planar). The self-planarizing conductive layer 410 provides a substantially more planar surface than deposition methods such as chemical vapor deposition (CVD), atomic layer deposition (ALD), physical vapor deposition (PVD), and the like. It should be noted, however, that the self-planarizing layer may not necessarily form a completely planar surface, but rather it provides a surface having a topology without sharp drop-offs of the underlying structures.

The conductive layer 410 may be formed, for example, by a spin-on process using a metal-filled polymer. The metal-filled polymer comprises a polymer material in which metal particles have been added, wherein the metal particles provide the conductivity necessary for the conductive layer, from which the gate electrode will be formed. Examples of metal particles that may be used include a refractory metal, a noble metal, combinations thereof, and the like. Other metals, metal-alloys, and metal-oxides may also be used. For example, metal-alloys and metal-oxides containing Ag, Au, Al, Cu, Ni, Pt, Ti, Ru, Pt, Re, Ge, Al, W, Mo, C, or the like may also be used. Liquid metals may also be used. However, it is preferred that liquid metals having a processing temperature below about 1000° C. be utilized.

The metal particles may be bound with resin binders such as silicones, acrylics, and polyurethanes and cured subsequently at temperatures ranging from room temperature (about 18° C.) to about 180° C. Alternatively, the curing process may be performed by an ultra-violet light process that activates the metal particles. The curing process binds the metal particles to the resin, which may then be spin-coated on the substrate. Other curing methods and temperatures may be used.

It is preferred that the conductive material used to form the conductive layer have a work function of about 4.65 eV for applications using a single midgap material. For other applications, such as applications having 2 or more conductive layers with near bandgap workfunctions or the like, it is preferred that the conductive material have a work function of about 4.1 eV (corresponding to N+ poly-silicon gate) and about 5.2 eV (corresponding to a P+ poly-silicon gate.

In an alternative embodiment, the conductive layer may comprise a volatile metal organic material, such as poly(3, 4-ethylenedioxy thiophene)/poly(styrenesulfonate (PEDT/PSS) or the like. These metal organic films may be spin coated onto a rotating wafer and subsequently heated to evaporate the organic film, thereby leaving a conductive, substantially planarized layer on the wafer surface.

Another method that may be used to create a self-planarizing conductive layer is applying the conductive layer via a pressurized tool such as a Sigma® Forcefill® metallization cluster tool offered by Trikon Technologies. Generally, the pressured tool, such as the Forcefill® tool, utilizes a combination of high temperatures and pressure to deposit a material. This technique has been used previously for filling vias having a high-aspect ratio. In accordance with the present teachings, this deposition technique may be utilized to form a layer having a substantially planar surface on a substrate.

The conductive layer 410 is preferably deposited to a thickness of about 10 Å to about 100 Å above the fins 312.

Figure 5:
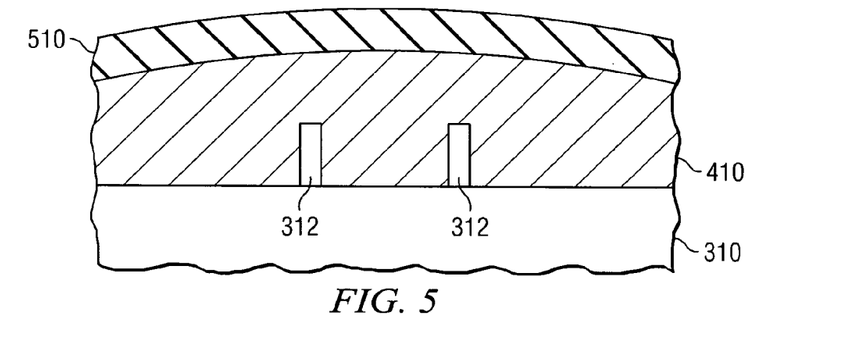

FIG. 5 illustrates the substrate 310 of FIG. 4 after a mask layer 510 has been formed over the fins 312 in accordance with an embodiment of the present invention. As can be seen from FIG. 5, the flatter surface on conductive layer 410 results in a mask layer 510 having a more uniform thickness. In particular, comparing the mask layer 510 of FIG. 5 with the mask layer 210 of FIG. 2b illustrates the drop-offs of the conductive layer 116 in regions 220 of FIG. 2 are missing in FIG. 5 where the surface of the conductive layer 116 is more planar. This creates a mask layer 510 that has a more uniform thickness that may be etch more consistently.

The mask layer 510 may be formed of an anti-reflective coating (ARC) such as silicon nitride. In an embodiment, silicon nitride is deposited by CVD or spin-on techniques to a thickness of about 100 Å to about 1000 Å.

Figure 6:
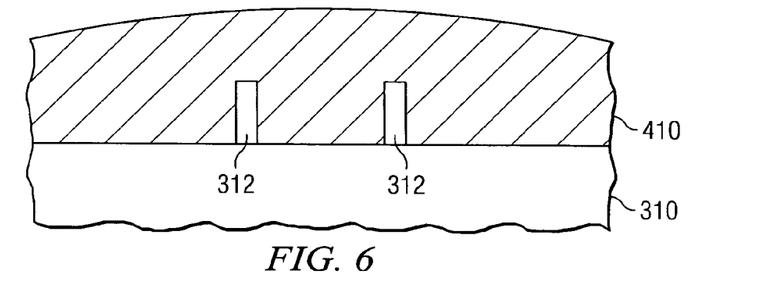

FIG. 6 illustrates the substrate 310 of FIG. 5 after the mask layer 510 has been patterned in accordance with an embodiment of the present invention. The mask layer 510 may be patterned by photolithography techniques as is known in the art. Generally, photolithography involves depositing a photoresist material, which is then masked, exposed, and developed. After the photoresist mask is patterned, an etching process may be performed to remove unwanted portions of the mask layer 510.

It should be noted that FIGS. 3–7 are a cross section along the A—A line of FIG. 1 and that the cross section is taken at a location in which the conductive layer (the gate electrode) is not desired. Accordingly, it is desired that all of the mask layers 510 in FIG. 5 be removed in FIG. 6. Comparing FIGS. 2c–2d to FIG. 5, it can be seen that prior art methods failed to remove the entire masking layer, which led to the formation of the parasitic spacers. In the present invention, the mask layer 510 in FIG. 5 is completely removed in FIG. 6 due to the substantially uniform thickness of the mask layer.

In embodiments in which the mask layer 510 comprises silicon nitride, the mask layer 510 may be removed by a wet dip in dilute hydrofluoric acid. Dilute hydrofluoric acid may, for example, be formed by a mixture of 1 part of concentrated (49%) hydrofluoric (HF) acid and 25 parts of water ($H_2O$). This mixture is commonly known as 25:1 HF. The mask layer 510 may also be removed using a mixture of concentrated sulphuric acid and hydrogen peroxide or a phosphoric acid and water solution.

Figure 7:
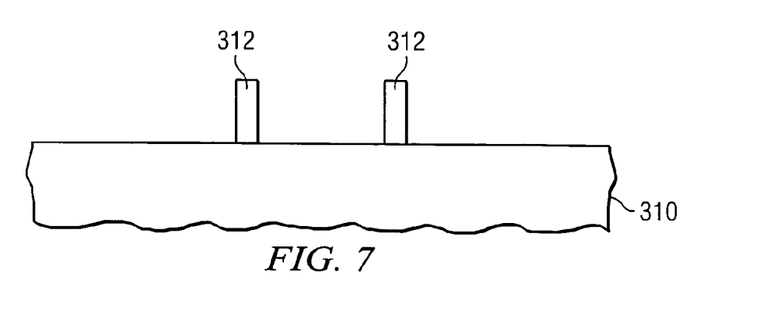

FIG. 7 illustrates the substrate 310 of FIG. 6 after the excess material of the conductive layer 410 has been removed in accordance with an embodiment of the present invention. As can be seen from FIG. 7, the excess material of the conductive layer 410 (FIG. 6) has been substantially removed. In particular, it can be seen that the parasitic spacers 222 of FIG. 2e have been removed.

In an embodiment, the conductive layer 410 may be removed, for example, by a dry etch process such as a reactive ion etch (RIE) process. The etching process may be performed in an ambient such as He, $Cl_2$, $O_2$/He, HBr, $O_2$, $CF_4$, $SF_6$, $SO_2$, or the like. The etching process is preferably performed at a temperature of less than about 100° C. Other etching processes, ambients, temperatures, and the like may be used.

Figure 8:
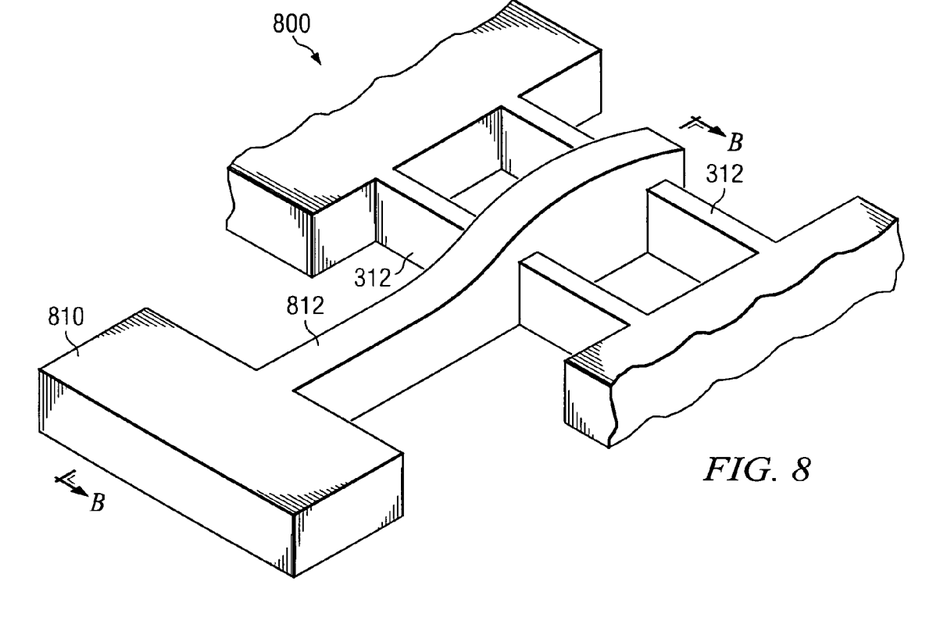
FIG. 8 is a perspective view of a dual-fin FinFET formed in accordance with an embodiment of the present invention.
Figure 9:
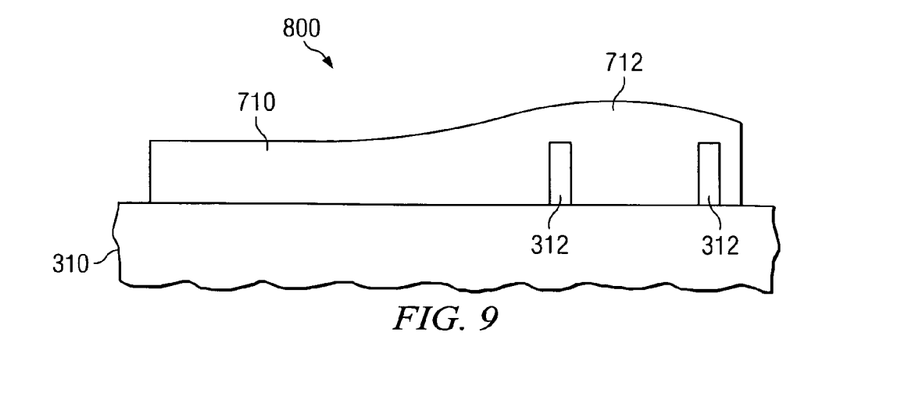
FIG. 9 is a cross-section view of a dual-fin FinFET formed in accordance with an embodiment of the present invention.

FIG. 8 illustrates a perspective view of a dual-fin FinFET 800 that may result from the process described above, and FIG. 9 is a cross-section view of the FinFET 800 taken along the B—B line (i.e., through the gate electrode) of FIG. 8. It should be noted that the gate electrode is thicker over the 310 (FIG. 9) than over portions positioned over the fins 312. As a result, the topography of the resulting gate electrode is substantially planar or flatter than the gate electrode shown in FIG. 1 and is devoid of the sharp angles of the underlying topography. The lack of sharp angles in the topography prevents the formation of the parasitic spacers and residual stingers shown in FIG. 1.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a FinFET, the method comprising:
    forming a source region on a substrate;
    forming a drain region on the substrate;
    forming one or more fins interconnecting the source region and the drain region;
    forming a self-planarizing conductive layer by spin-coating a layer of polymer based material over the substrate and the one or more fins, the self-planarizing conductive layer having a substantially flatter topography than an underlying topography;
    forming a mask layer over the self-planarizing conductive layer;
    patterning the mask layer to define a gate electrode; and
    removing excess portions of the self-planarizing conductive layer such that remaining portions of the self-planarizing conductive layer form the gate electrode.

2. The method of claim 1, wherein the polymer-based material comprises a polymer with metallic particles.

3. The method of claim 2, wherein the metallic particles comprise particles of a refractory metal, a noble metal, or a combination thereof.

4. A method of forming a FinFET, the method comprising:
    forming a source region on a substrate;
    forming a drain region on the substrate;
    forming one or more fins interconnecting the source region and the drain region;
    forming a self-planarizing conductive layer over the substrate and the one or more fins, the self-planarizing conductive layer having a substantially flatter topography than an underlying topography, wherein the forming the self-plan conductive layer is performed by depositing a metal organic film and heating the metal organic film, thereby evaporating organic materials of the metal organic film and forming a conductive layer;

forming a mask layer over the self-planarizing conductive layer;

patterning the mask layer to define a gate electrode; and removing excess portions of the self-planarizing conductive layer such that remaining portions of the self-planarizing conductive layer form the gate electrode.

5. A method of forming a FinFET, the method comprising:

forming a source region on a substrate;

forming a drain region on the substrate;

forming one or more fins interconnecting the source region and the drain region;

forming self-planarizing conductive layer over the substrate and the one or more fins, the self-planarizing conductive layer having a substantially flatter topography than an underling topography, wherein the forming the self-planarizing conductive layer is performed by depositing a conductive layer over the substrate and subjecting the conductive material to pressure sufficient to substantially planarize the conductive layer;

forming a mask layer over the self-planarizing conductive layer;

patterning the mask layer to define a gate electrode; and removing excess portions of the self-planarizing conductive layer such that remaining portions of the self-planarizing conductive layer form the gate electrode.

6. The method of claim 1, wherein the self-planarizing conductive layer comprises a metal-filled polymer.

7. The method of claim 5, wherein the self-planarizing conductive layer includes a metal-alloy, a metal-oxide, or a combination thereof.

8. A transistor formed on a substrate, the transistor comprising:

a source region formed on the substrate;

a drain region formed on the substrate;

one or more fins interconnecting the source region and the drain region; and a gate electrode overlying the fins, a surface of the gate electrode having a substantially planar surface, wherein the gate electrode comprises a polymer with metallic particles.

9. The transistor of claim 8, wherein the metallic particles comprise particles of a refractory metal, a noble metal, or a combination thereof.

10. The transistor of claim 8, wherein the gate electrode comprises a metallic film.

11. The transistor of claim 8, wherein the gate electrode has a thickness about 100 Å to about 1000 Å above the fins.

12. The transistor of claim 8, wherein the gate electrode comprises a dual-gate electrode.

13. The transistor of claim 8, wherein the gate electrode comprises a triple-gate electrode.

14. The transistor of claim 8, wherein the gate electrode is formed from a material comprising a metal-filled polymer, an organic polymer, or a combination thereof.

15. The transistor of claim 8, wherein the gate electrode is formed from a metal-alloy, a metal-oxide, or a combination thereof.

16. The method of claim 1, wherein the self-planarizing conductive layer comprises an organic polymer.

17. A transistor formed on a substrate, the transistor comprising:

a source region formed on the substrate;

a drain region formed on the substrate;

one or more fins interconnecting the source region and the drain region; and a gate electrode overlying the fins, a surface of the gate electrode having a substantially planar surface, wherein the gate electrode is formed from a liquid metal.

18. The transistor of claim 17, wherein the gate electrode has a thickness about 100 Å to about 1000 Å above the fins.

19. The transistor of claim 17, wherein the gate electrode comprises a dual-gate electrode.

20. The transistor of claim 17, wherein the gate electrode comprises a triple-gate electrode.

* * * * *

UNITED STATES PATENT AND TRADEMARK OFFICE
CERTIFICATE OF CORRECTION

PATENT NO. : 7,094,650 B2  Page 1 of 1
APPLICATION NO. : 11/039173
DATED : August 22, 2006
INVENTOR(S) : Chaudhary et al.

It is certified that error appears in the above-identified patent and that said Letters Patent is hereby corrected as shown below:

Column 1, line 41; delete "116" insert -- 114 --
Column 1, line 64; delete "the." insert -- the --
Column 4, line 43; delete "C." insert -- C --
Column 4, line 47; delete "C." insert -- C --
Column 4, line 60; delete "gate." insert -- gate). --
Column 5, line 24; delete "etch" insert -- etched --
Column 6, lines 10-11; delete "the 310" insert -- the substrate 310 --
Column 7, line 1; delete "self-plan" insert -- self-planarizing --
Column 7, line 16; between "forming" and "self-planarizing" insert -- a --

Signed and Sealed this

Fourteenth Day of November, 2006

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,094,650 B2 | Page 1 of 1 |
| APPLICATION NO. | : 11/039173 | |
| DATED | : August 22, 2006 | |
| INVENTOR(S) | : Chaudhary et al. | |

It is certified that error appears in the above-identified patent and that said Letters Patent is hereby corrected as shown below:

Column 1, line 41; delete "116" insert -- 114 --
Column 1, line 64; delete "the." insert -- the --
Column 4, line 43; delete "C." insert -- C --
Column 4, line 47; delete "C." insert -- C --
Column 4, line 60; delete "gate." insert -- gate). --
Column 5, line 24; delete "etch" insert -- etched --
Column 6, lines 10-11; delete "the 310" insert -- the substrate 310 --
Column 7, line 1; delete "self-plan" insert -- self-planarizing --
Column 7, line 16; between "forming" and "self-planarizing" insert -- a --

Signed and Sealed this

Twelfth Day of December, 2006

JON W. DUDAS
*Director of the United States Patent and Trademark Office*